(12) United States Patent
Son et al.

(10) Patent No.: US 10,374,194 B2
(45) Date of Patent: Aug. 6, 2019

(54) FLEXIBLE DISPLAY DEVICE

(71) Applicant: LG Display Co., Ltd., Seoul (KR)

(72) Inventors: HaeJoon Son, Gyeonggi-do (KR); SieHyug Choi, Gyeonggi-do (KR); JuhnSuk Yoo, Seoul (KR); MoonGoo Kim, Gyeonggi-do (KR); Jehong Park, Seoul (KR); Chiwoong Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/851,427

(22) Filed: Dec. 21, 2017

(65) Prior Publication Data
US 2018/0114944 A1 Apr. 26, 2018

Related U.S. Application Data

(63) Continuation of application No. 15/235,818, filed on Aug. 12, 2016, now Pat. No. 10,153,457.

(30) Foreign Application Priority Data

Aug. 13, 2015 (KR) .................. 10-2015-0114888

(51) Int. Cl.
*H01L 51/00* (2006.01)
*H01L 51/52* (2006.01)
(Continued)

(52) U.S. Cl.
CPC ........ *H01L 51/5253* (2013.01); *H01L 25/167* (2013.01); *H01L 27/3276* (2013.01);
(Continued)

(58) Field of Classification Search
CPC .......................... H01L 25/167; H01L 29/6653
See application file for complete search history.

(56) References Cited

U.S. PATENT DOCUMENTS 9,326,375 B2  4/2016 Lee
9,666,833 B2  5/2017 Gao et al.
(Continued)

FOREIGN PATENT DOCUMENTS

CN   102916033 A   2/2013
CN   104393014 A   3/2015
(Continued)

OTHER PUBLICATIONS

Extended European Search Report dated Jan. 19, 2017 for the corresponding European parent application No. 16176231.5.
(Continued)

*Primary Examiner* — Lex H Malsawma
*Assistant Examiner* — Geoffrey H Ida
(74) *Attorney, Agent, or Firm* — Morgan, Lewis & Bockius LLP

(57) ABSTRACT

A flexible display device comprises a flexible substrate including a display area and a non-display area; a display layer in the display area on a first surface of the flexible substrate; a polarizing plate on the display layer; and a cover coat in the non-display area on the first surface of the flexible substrate, the cover coat including a first end portion overlapping with the polarizing plate. At least a portion of the non-display area of the flexible substrate and the cover coat are bendable in a bending direction.

18 Claims, 18 Drawing Sheets

(51) Int. Cl.
  *H01L 25/16* (2006.01)
  *H01L 27/32* (2006.01)
(52) U.S. Cl.
  CPC ...... *H01L 51/0097* (2013.01); *H01L 51/5246* (2013.01); *H01L 51/5281* (2013.01); *H01L 2251/5338* (2013.01); *Y02E 10/549* (2013.01)

(56) References Cited

U.S. PATENT DOCUMENTS

| | | |
|---|---|---|
| 9,769,919 B2 | 9/2017 | Park et al. |
| 2008/0268618 A1 | 10/2008 | Yamazaki |
| 2010/0293782 A1 | 11/2010 | Yamazaki et al. |
| 2013/0034685 A1 | 2/2013 | An et al. |
| 2014/0021499 A1 | 1/2014 | Jang |
| 2014/0217382 A1 | 8/2014 | Kwon et al. |
| 2014/0217397 A1 | 8/2014 | Kwak et al. |
| 2014/0307396 A1 | 10/2014 | Lee |
| 2015/0036300 A1 | 2/2015 | Park et al. |
| 2015/0137098 A1 | 5/2015 | Tanaka |
| 2016/0351849 A1 | 12/2016 | Gao et al. |

FOREIGN PATENT DOCUMENTS

| | | |
|---|---|---|
| KR | 20140099174 A | 8/2014 |
| KR | 20140122597 A | 10/2014 |
| KR | 20150014713 A | 2/2015 |

OTHER PUBLICATIONS

Chinese Office Action, dated Oct. 10, 2018, for the counterpart Chinese patent application No. 201610658492.2.

FLEXIBLE DISPLAY DEVICE

This application is a Continuation of U.S. patent application Ser. No. 15/235,818, filed on Aug. 12, 2016, which claims the benefit of Korean Patent Application No. 10-2015-0114888 filed in Korea on Aug. 13, 2015. The entire contents of each of these prior U.S. and Korean patent applications are incorporated herein by reference for all purposes as if fully set forth herein.

BACKGROUND OF THE INVENTION

Field of the Invention

The present disclosure relates to a flexible display device.

Description of the Related Art

Display devices have been used in, among others, computer monitors, televisions, and cellular phones. Such display device include an organic light emitting diodes (OLED) display device, a plasma display panel (PDP) display device, and others that emit light without a separate light source, and a liquid crystal display device and others that incorporate a separate light source.

Recently, a flexible display device has been receiving attention as a next generation display device. A flexible display may be manufactured by forming a display panel (or a display layer), wiring, and other elements on a flexible substrate, which is made of a flexible material, such as plastic, so that an image can be displayed under a bent condition like paper.

The flexible display device may have a variety of applications, not only in a computer monitor or a TV but also in a personal mobile device. Accordingly, a flexible display device having reduced volume and weight while exhibiting a wide display area has been studied.

In such a flexible display device, a crack may occur in the flexible substrate or the wiring due to various causes when the display device is bent. This crack in the flexible substrate or the wiring may cause a failure of the flexible display device.

SUMMARY OF THE INVENTION

Accordingly, the present invention is directed to a flexible display device that substantially obviates one or more of the problems due to limitations and disadvantages of the related art.

An object of the present invention is to provide a flexible display device capable of preventing or minimizing cracks in a flexible substrate or wiring when the flexible display device is bent. Another object of the present invention is to prevent or minimize a failure in a flexible display device.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a flexible display device may include: a flexible substrate including a display area and a non-display area; a display layer in the display area on a first surface of the flexible substrate; a polarizing plate on the display layer; and a cover coat in the non-display area on the first surface of the flexible substrate, the cover coat including a first end portion overlapping with the polarizing plate, wherein at least a portion of the non-display area of the flexible substrate and the cover coat are bendable in a bending direction.

In another aspect, a flexible display device may include: a flexible substrate including a display area and a non-display area; a display layer in the display area on a first surface of the flexible substrate; at least one additional layer on the display layer; and a cover coat disposed in the non-display area on the first surface of the flexible substrate, the cover coat including an end portion overlapping with the one additional layer and disposed between the display layer and the one additional layer, wherein at least a portion of the non-display area of the flexible substrate and the cover coat are bendable in a bending direction.

In yet another aspect, a flexible display device may include: a flexible substrate including a display area and a non-display area; a display layer in the display area on a first surface of the flexible substrate; a bendable cover coat disposed in the non-display area on the first surface of the flexible substrate; a first back plate disposed in the display area on a second surface of the flexible substrate opposite the first surface; a second back plate disposed in the non-display area on the second surface of the flexible substrate; and a supporting member positioned between the first back plate and the second back plate when the flexible substrate is bent in the bending direction.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate example embodiments of the invention and together with the description serve to explain the principles of the invention. In the drawings.

DETAILED DESCRIPTION OF EXAMPLE EMBODIMENTS

Figure 1:
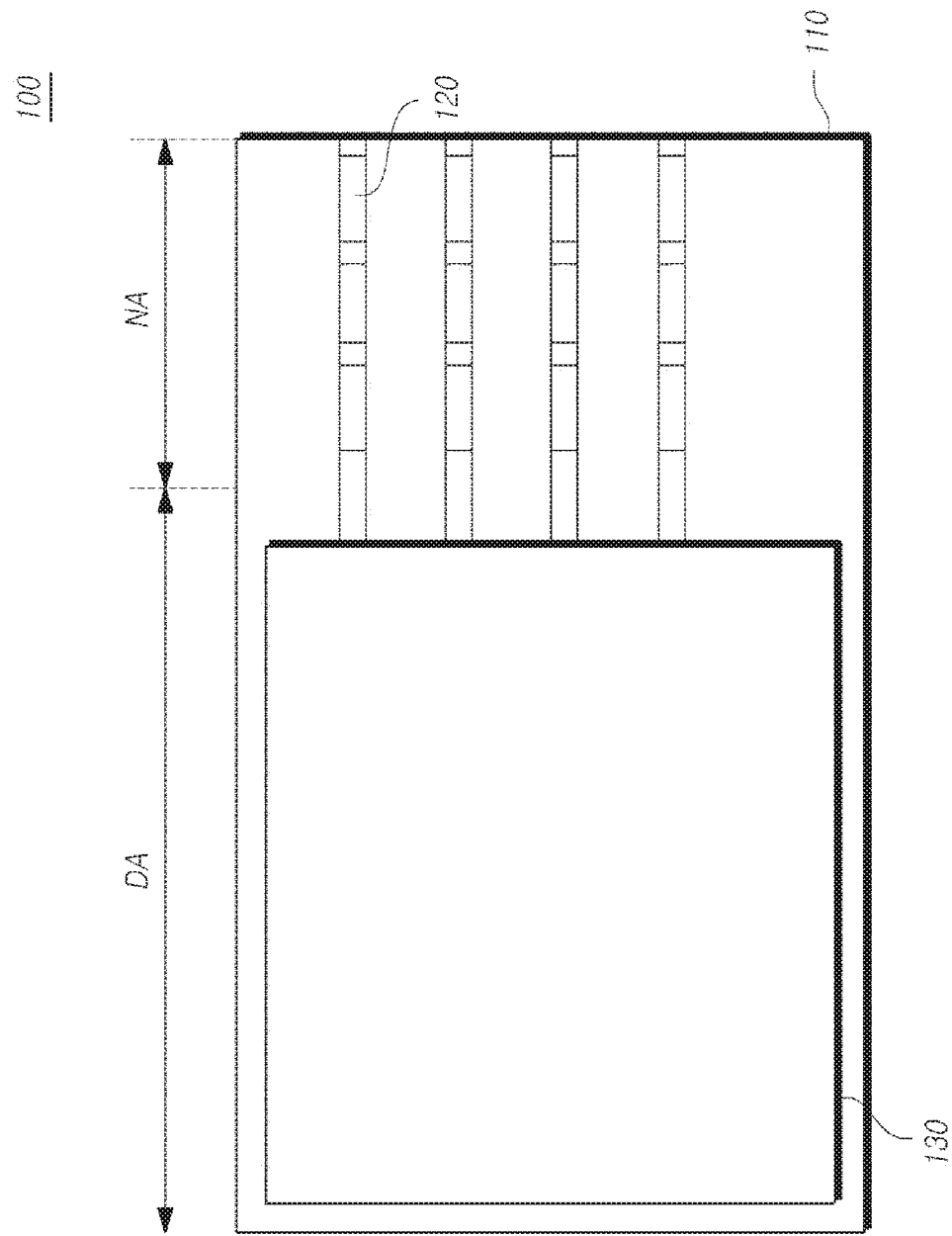
FIG. 1 is a plan view of an example flexible display device according to an example embodiment in a non-bent condition.

Reference will now be made in detail to embodiments of the present invention, examples of which are illustrated in the accompanying drawings. With respect to reference numerals for components throughout the drawings, like reference numerals may designate like components even though components are shown in different drawings. Further, in the description of example embodiments of the present invention, a detailed explanation of well-known components or functions may be omitted to avoid unnecessarily obscuring the subject matter of the present invention.

Further, in describing components of the present invention, terms such as first, second, A, B, (a), (b), and so on may be used. Unless otherwise specified, these terms are used only to differentiate the components from other components such that the nature, order, sequence, or number of the corresponding components is not limited by these terms. Also unless otherwise specified, it is to be understood that when one element is referred to as being "connected to" or "coupled to" another element, it may be directly connected to or directly coupled to another element, or indirectly connected to or coupled to another element though yet another element "intervening" therebetween, or "connected to" or "coupled to" another element via still another element.

In this specification, a flexible display device broadly refers to a display device with a flexible substrate, and broadly encompasses devices that may be referred to as a bendable display device, a rollable display device, an unbreakable display device, a foldable display device, and other similar devices. In this specification, a flexible OLED display device is an example of a flexible display device.

In this specification, the display device may have a display area and a non-display area. The display area is an area in which an image or the like is displayed, and the non-display area is an area, such as a bezel, in which an image is not displayed.

FIG. 1 is a plan view of a flexible display device according to an embodiment when the display device is not bent. As shown in FIG. 1, a flexible display device 100 includes a flexible substrate 110, wiring 120, and a display layer or display panel 130.

The flexible substrate 110 is a substrate that supports various elements of the flexible display device 100, and has softness or flexibility. The flexible substrate 110 may be referred to as a soft substrate, a first soft substrate, or a flexible member. When being made of plastic, the flexible substrate 110 may be referred to as a plastic film, a plastic substrate, or a first soft substrate. The flexible substrate 110 may be formed in the shape of a rectangular parallelepiped, but is not limited thereto and can be formed in various shapes.

The flexible substrate 110 is made of soft material. For example, the flexible substrate 110 may be a film including one selected from a group of polyester-based polymer, silicone-based polymer, acrylic polymer, polyolefin-based polymer, and copolymer of them. Specifically, the flexible substrate 110 includes one selected from a group of polyethylene terephthalate (PET), polybutylene terephthalate (PBT), polysilane, polysiloxane, polysilazane, polycarbosilane, polyacrylate, polymethacrylate, polymethylacrylate, polymethylmetacrylate, polyethylacrylate, polyethylmetacrylate, cyclic olefin copolymer (COC), cyclic olefin polymer (COP), polyethylene (PE), polypropylene (PP), polyimide (PI), polymethylmethacrylate (PMMA), polystyrene (PS), polyacetal (POM), polyetheretherketone (PEEK), polyester sulfone (PES), polytetrafluoroethylene (PTFE), polyvinyl chloride (PVC), polycarbonate (PC), polyvinylidene fluoride (PVDF), perfluoroalkyl polymers (PFA), a styrene acrylic polymer nitro rilko (SAN), and a combination of them. In some example embodiments, when the flexible display device 100 is implemented as a transparent flexible display device, the flexible substrate 110 is formed of a transparent soft material.

The flexible substrate 110 may include a display area (DA) and a non-display area (NA). The display area (DA) of the flexible substrate is an area in which a real image is displayed, and the non-display area (NA) of the flexible substrate 110 is an area in which an image is not displayed.

The non-display area (NA) of the flexible substrate 110 may be an area extending from the periphery of the display area (DA) of the flexible substrate 110. The non-display area (NA) of the flexible substrate 110 may be an area extending from a side of the display area (DA) of the flexible substrate 110. For example, when the display area (DA) of the flexible substrate 110 is formed in a polygonal shape, the non-display area (NA) of the flexible substrate 110 may extend from a side of the display area (DA) of the flexible substrate 110. A non-display area (NA) of the flexible substrate 110 which extends from a side of the display area (DA) of the flexible substrate 110 is illustrated in FIG. 1 as an example for the convenience of description, but is not limited thereto. Therefore, the non-display area (NA) of the flexible substrate 110 may extend from a plurality of sides of the display area (DA) of the flexible substrate 110.

As the non-display area (NA) of the flexible substrate 110 may be disposed in peripheral areas or edge areas of the display area (DA) of the flexible substrate 110, and various circuits for displaying image may be arranged therein, the non-display area (NA) may be referred to as, among others, a peripheral area, a peripheral circuit area, an edge area, or a bezel area.

The display layer 130 may be disposed in the entire area or a portion area of the display area (DA) of the flexible substrate 110. The display layer 130 is an element for displaying a real image and may be referred to as an image display layer. The display layer 130 described herein as an example is an organic light-emitting display layer that includes an organic light-emitting device to display an image via an organic light-emitting layer and a thin film transistor to drive the organic light-emitting device. However, the display layer 130 is not limited to such a specific example and broadly encompasses a display layer capable of displaying an image.

The thin film transistor of the display layer 130 may include, for example, an active layer, a gate insulating layer, a gate electrode, an intermediate insulating layer disposed on the gate electrode and the active layer, and a source electrode and a drain electrode electrically connected to the active layer. The organic light-emitting device may include a first electrode electrically connected to any one of the source electrode and the drain electrode, an organic light-emitting layer disposed on the first electrode, and a second electrode disposed on the organic light-emitting layer.

Various elements not directly displaying an image may be disposed in the non-display area (NA) of the flexible substrate 110. Examples of the elements disposed in the non-display area (NA) of the flexible substrate 110 include, among others, various drive integrated circuits, such as a gate drive integrated circuit (IC) and a data drive integrated circuit (IC), and a drive circuit section. Here, the various drive ICs and the drive circuit section may be mounted in the flexible substrate 110 in a Gate in Panel (GIP) format, or may be connected to the flexible substrate 110 in a Tape Carrier Package (TCP) or a Chip On Film (COF) format.

The wiring 120 may be disposed on the flexible substrate 110. The wiring 120 may electrically connect the display layer 130 disposed in the display area (DA) of the flexible substrate 110 to the drive circuit section, or to the gate drive IC and the data drive IC disposed in the non-display area (NA) of the flexible substrate 110 for signal transmission.

The wiring 120 is formed of a conductive material, and is formed of a conductive material with excellent softness or flexibility in order to minimize the occurrence of a crack when the flexible substrate is bent. For example, the wiring 120 may be formed of a conductive material with excellent softness such as gold (Au), silver (Ag), aluminum (Al), and the like. However, components of the wiring 120 are not limited thereto, and the wiring 120 may be formed of one of various conductive materials used in manufacturing the display layer 130, such as molybdenum (Mo), chrome (Cr), titanium (Ti), nickel (Ni), neodymium (Nd), copper (Cu), an alloy of silver (Ag) and magnesium (Mg), or other similar conductive materials used in manufacturing the display layer 130. The wiring 120 may be formed in a multilayered structure including one or more of the various conductive materials described above. For example, the wiring 120 may be formed in a three-layered structure of titanium (Ti)/aluminum (Al)/titanium (Ti), but is not limited thereto.

At least a portion of the non-display area (NA) of the flexible substrate 110 may be formed in a shape that is bent in a bending direction. Here, at least the portion of the non-display area (NA) of the flexible substrate 110 having a shape that is bent in the bending direction is referred to as a bend area. As the non-display area (NA) of the flexible substrate 110 is not configured to display an image, the non-display area (NA) does not need to include display elements on the upper surface of the flexible substrate 110 and at least a portion of the non-display area (NA) may be bent. For the convenience of description, FIG. 1 illustrates an example in which the entire non-display area (NA) of the flexible substrate 110 is a bend area. However, the bend area is not limited thereto, and only a portion of the non-display area (NA) of the flexible substrate 110 may be the bend area. For the convenience of description, FIG. 1 illustrates an example in which the non-display area (NA) of the flexible substrate 110 is slightly narrower than the display area (DA) of the flexible substrate 110, but the non-display area (NA) of the flexible substrate 110 may be significantly narrower than the display area (DA) of the flexible substrate 110.

The bend area, which is at least a portion of the non-display area (NA) of the flexible substrate 110, may be formed in a shape that is bent in the bending direction. In FIG. 1, the bending direction is a lateral direction of the flexible substrate 110. Thus, FIG. 1 illustrates an example in which the bend area is at least a portion of the non-display area (NA) of the flexible substrate 110 that is bent in the lateral direction of the flexible substrate 110.

Figure 2:
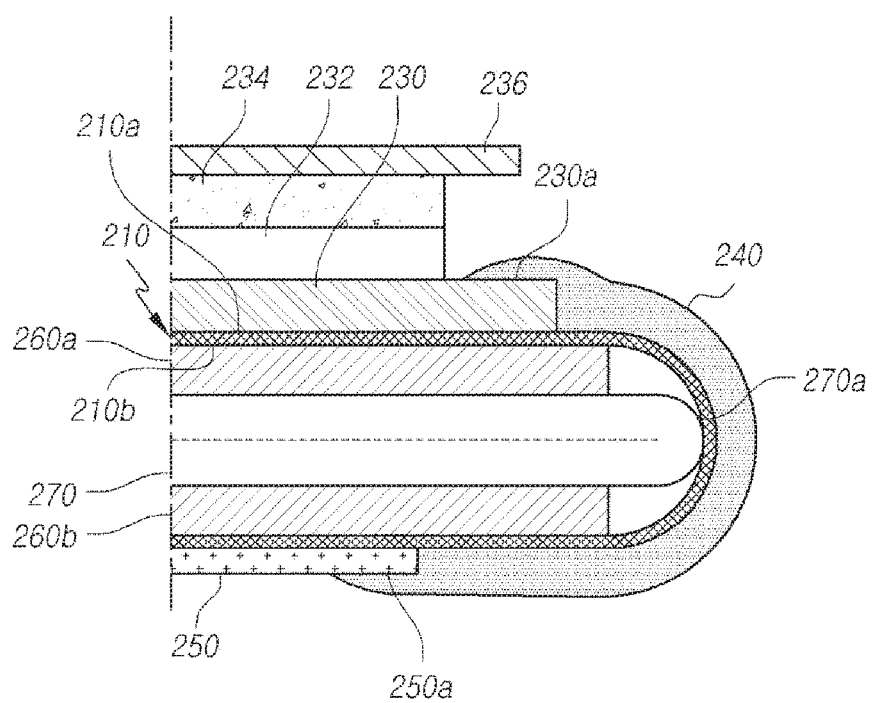
FIG. 2 is a cross section of an example flexible display device according to an example embodiment under a bent condition.
Figure 3:
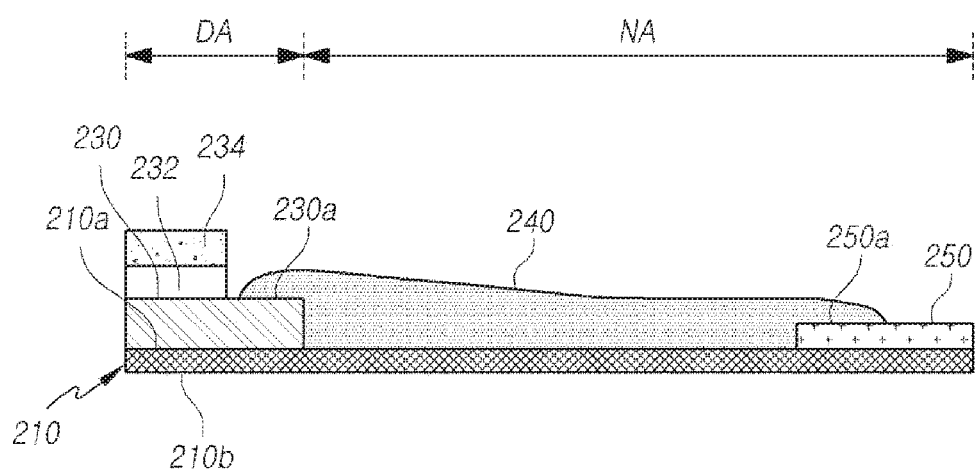
FIG. 3 is a cross section of a flexible substrate, a display layer, and a connection member of a drive integrated circuit of the flexible display device of FIG. 2 under a non-bent condition.

Hereinafter, various examples of flexible display devices under a bent condition will be described with reference to the accompanying drawings. FIG. 2 is a cross section of an example of a flexible display device under a bent condition. FIG. 3 is a cross section of a flexible substrate, a display layer, and a connection member of a drive integrated circuit of the flexible display device of FIG. 2 under a non-bent condition. As shown in FIGS. 2 and 3, a flexible display device 200 may be bent in a shape in which at least a portion of a non-display area (NA) of a flexible substrate 210 is bent in a bending direction.

A display layer 230 is disposed on a display area (DA) of a first surface 210a of the flexible substrate 210. A cover coat 240 may be disposed on the non-display area (NA) of the first surface 210a of the flexible substrate 210 to prevent moisture permeation or crack occurrence. The cover coat 240 may be disposed in the bend area described with reference to FIG. 1.

A drive integrated circuit (IC) connection member 250 may be disposed on the non-display area (NA) of the first surface 210a of the flexible substrate 210. Various drive integrated circuits, such as a gate or data drive IC, a drive circuit section, and the like, may be mounted on the drive IC connection member 250. The drive IC connection member 250 may be at least one of the tape carrier package (TCP) and the chip on film (COF). The wiring 120 illustrated in FIG. 1 is disposed on the flexible substrate 210, but is not shown in FIGS. 2 and 3 for the convenience of description.

The cover coat 240 is disposed between the display layer 230 and the drive IC connection member 250, and may cover a portion 230a of the display layer 230 and a portion 250a of the drive IC connection member 250.

A polarizing layer 232 may be disposed on the display layer 230, but is not limited thereto. A over coat layer 236 may be disposed on the polarizing layer 232, with an adhesive layer 234 bonding the polarizing layer 232 and the over coat layer 236 together.

At least a portion of the non-display area (NA) of the flexible substrate 210 and the cover coat 240 may be bent in the bending direction. On a second surface 210b of the flexible substrate 210 opposite the first surface 210a, a first back plate 260a and the second back plate 260b may be disposed. The first back plate 260a may be disposed to correspond to the display layer 230. The second back plate 260b may be disposed to correspond to the drive IC connection member 250 and be positioned under the first back plate 260a when the flexible substrate 210 is bent in the bending direction.

A supporting member 270 may be positioned to be in contact with a bend area of the second surface 210b of the flexible substrate 210 between the first back plate 260a and the second back plate 260b in the vertical direction to support the flexible substrate 210. A head 270a of the supporting member 270 may have a semicircular shape with a shorter radius than that of the bent flexible substrate 210. Therefore, the head 270a of the supporting member 270 may be in surface to surface contact with the bend area of the second surface 210b of the flexible substrate 210.

When the flexible substrate 210 is bent in the bending direction, tension is created in the flexible substrate 210. In the flexible substrate 210, the most powerful tension is created in the bending direction and may cause a crack in the flexible substrate 210 itself. Also, a crack may occur in the flexible substrate 210 due to an external impact. Further, the crack may propagate to the display layer 230. Such a crack of the flexible substrate 210 may also cause breaking of the wiring (not shown) disposed in the non-display area (NA). The wiring (not shown) may be positioned in an intermediate surface by using the cover coat 240 so that a crack in the wiring can be prevented in a bent state of the flexible display.

In the flexible display device 200, a bend of the display layer 230 may be needed to reduce the bezel area, and the cover coat 240 may be formed to prevent moisture permeation and cracks in the bend area. It is possible to prevent cracks by positioning the head 270*a* of the supporting member 270 to contact the bend area of the second surface 210*b* of the flexible substrate 210 to support the bend area.

Figure 4A:
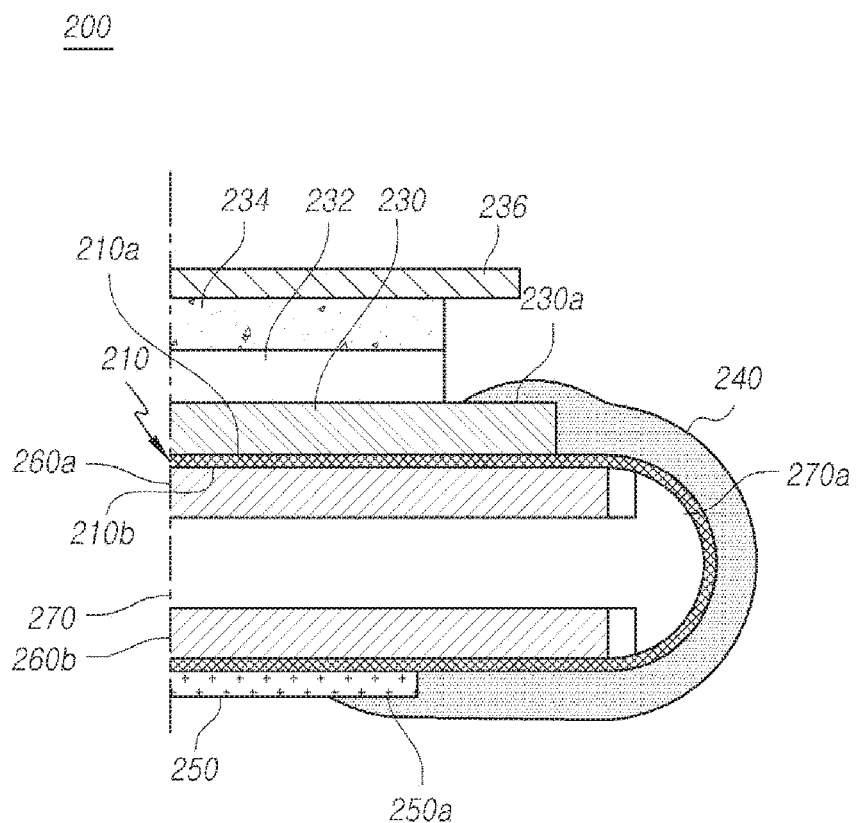
FIGS. 4A to 4C are cross-sections of modified examples of the flexible display device of FIG. 2.
Figure 4B:
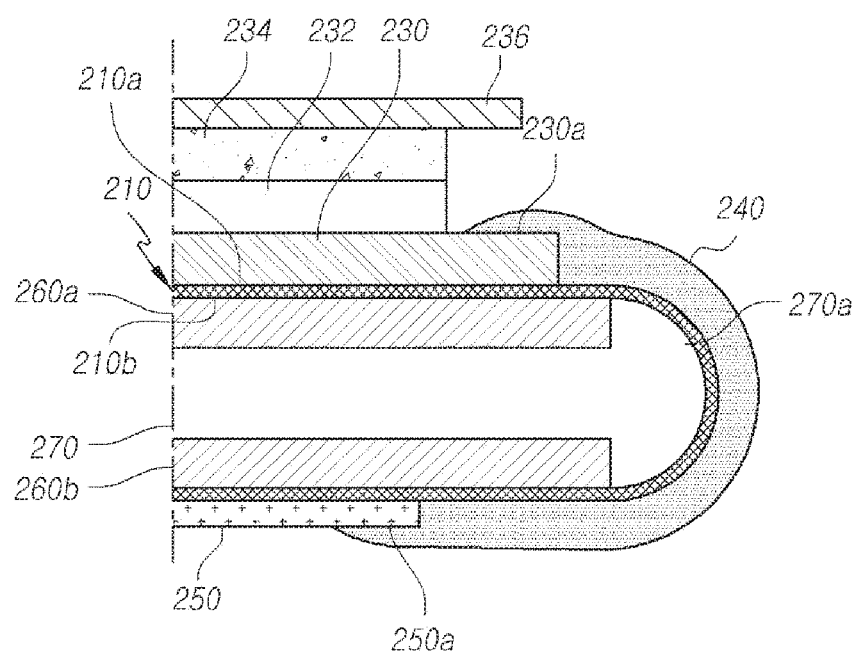

As illustrated in FIGS. 4A and 4B, the head 270*a* of the supporting member 270 may be configured to be a semicircular shape having a radius substantially equal to the radius of the bend area of the flexible substrate 210 in the flexible display device 200 described above so as to position the head 270*a* of the supporting member 270 to be entirely in surface to surface contact with the second surface 210*b* of the flexible substrate 210 and to improve the stability and curvature reliability of the supporting member 270. Therefore, it is possible to improve the effectiveness of the supporting member 270 in preventing wiring cracks in the entire bend area of the second surface 210*b* of the flexible substrate 210.

Figure 4C:
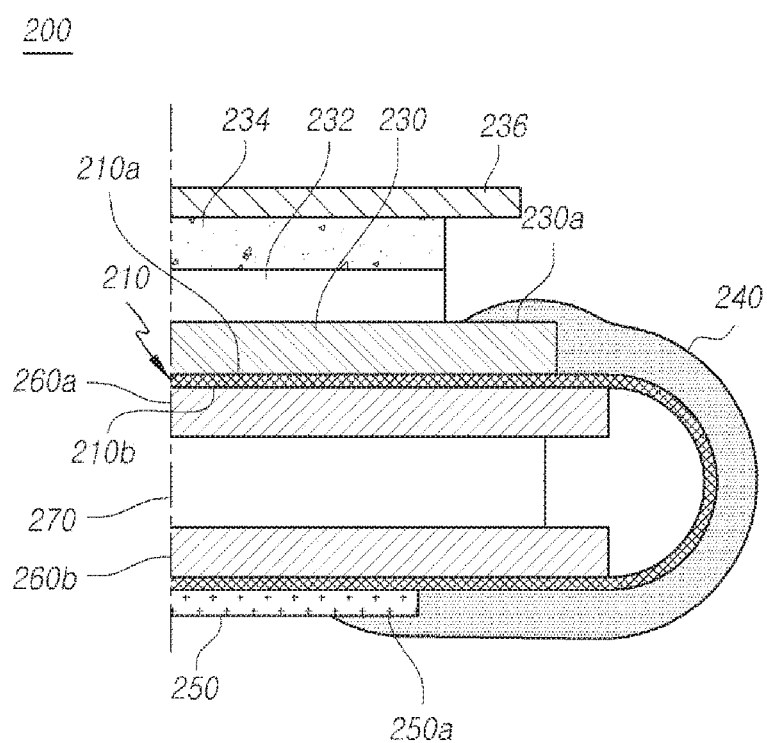

As illustrated in FIG. 4C, the supporting member 270 may not include the head 270*a* in surface to surface contact with the bend area of the second surface 210*b* of the flexible substrate 210. This example configuration may reduce or prevent wiring cracks that may be caused by an impact on the flexible substrate 210 by the supporting member 270.

The cover coat 240 may be formed by using various materials through various processes. For example, as illustrate in FIG. 5, the cover coat 240 may be formed by coating organic resin (for example, acrylic resin) through a jetting process. The display layer 230 and the wiring (not shown) are formed in the display area (DA) and the non-display area (NA) of the flexible substrate 210, respectively. Then, the drive IC connection member 250 with one or more drive ICs may be disposed on the flexible substrate 210 and connected to the wiring. The cover coat 240 may be formed by coating the organic resin 410 over the flexible substrate 210 between an end 230*a* of the display layer 230 and an end 250*a* of the drive IC connection member 250 using a jetting apparatus 400, and performing a hardening process by using ultraviolet (UV) or the like.

Figure 5:
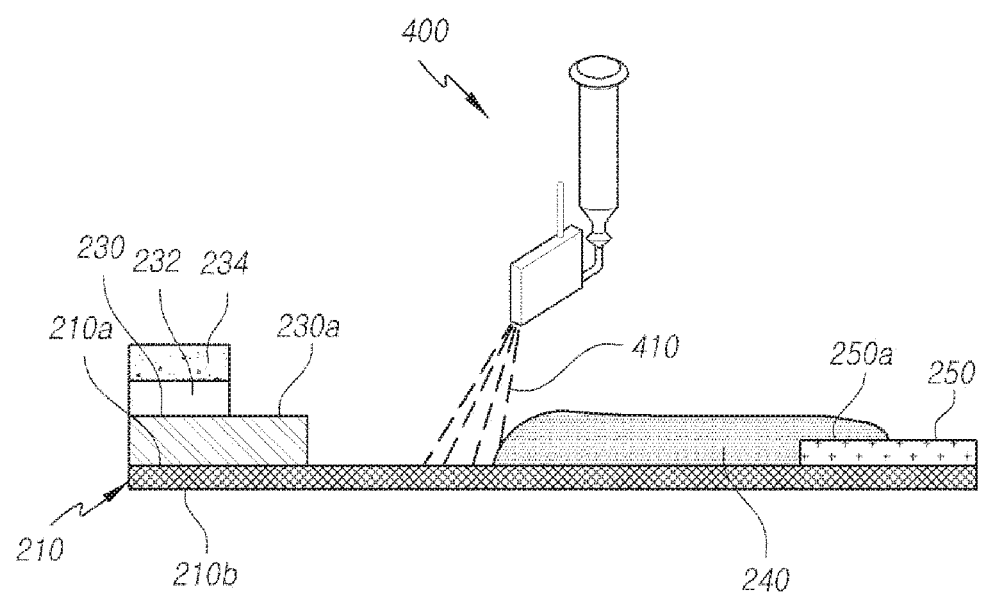
FIG. 5 is a diagram illustrating an example process of manufacturing a cover coat of FIG. 2.
Figure 6A:
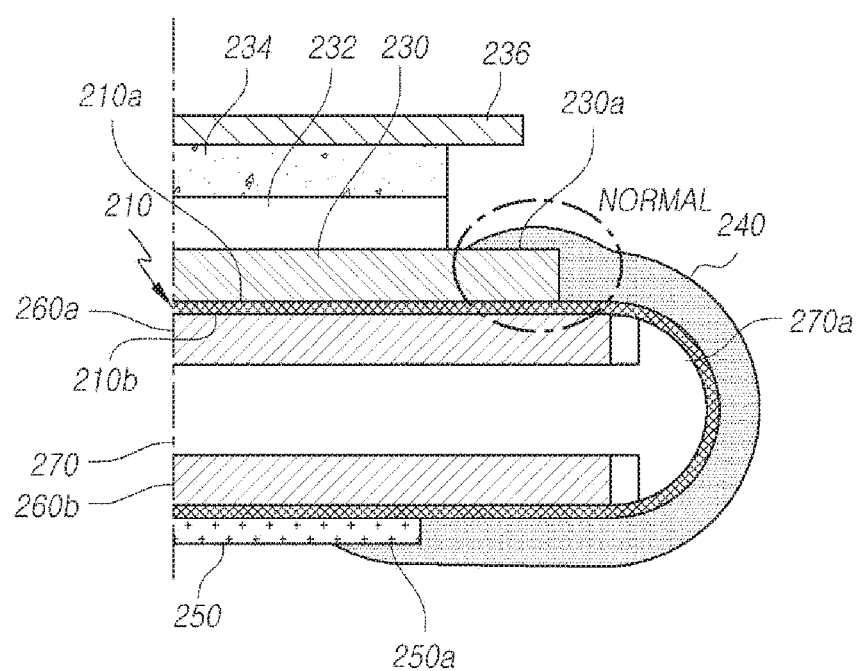
FIGS. 6A and 6B are diagrams respectively illustrating a case in which the cover coat is normally formed and a case in which the cover coat is abnormally formed based on a process error, when the cover coat is formed by using a jetting process of FIG. 5.
Figure 6B:
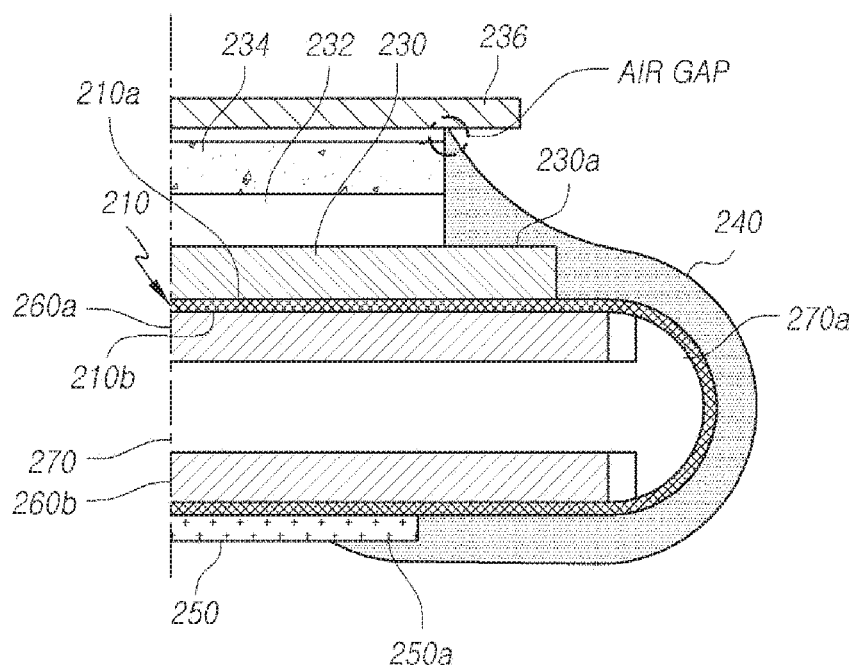

FIGS. 6A and 6B respectively illustrate an example in which the cover coat 240 is normally formed and an example in which the cover coat 240 is abnormally formed based on a process error, when the cover coat 240 is formed with the jetting process of FIG. 5.

As illustrated in FIG. 6A, when the cover coat 240 is formed through the jetting process, as described above, the organic resin 410 for the cover coat 240 is to be coated on the end 230*a* of the display layer 230, and is not to be coated on the polarizing layer 232 on the display layer 230 or on the adhesive layer 234 for bonding the polarizing layer 232 and the over coat layer 236 together. As illustrated in FIG. 6B, due to a process error of the jetting process, the organic resin 410 may be coated on the polarizing layer 232 on the display layer 230 or the adhesive layer 234 for bonding the polarizing layer 232 and the over coat layer 236 together. If the organic resin 410 is coated on the adhesive layer 234 for bonding the polarizing layer 232 and the over coat layer 236 together due to the process error and is hardened, an air gap may occur between the adhesive layer 234 and the over coat layer 236 when bonding the over coat layer 236 with the polarizing layer 232 with the adhesive layer 234 due to a portion of the cover coat 240 protruding over the adhesive layer 234. Bubbles may occur between the adhesive layer 234 and the over coat 236 layer, potentially causing adhesion failure of the over coat layer 236 or panel failure.

Hereinafter, example embodiments of a flexible display device capable of preventing or mitigating adhesion failure of an over coat layer or panel failure, even when a cover coat is formed over a flexible substrate with the jetting process, will be described with reference to the accompanying drawings.

Figure 7:
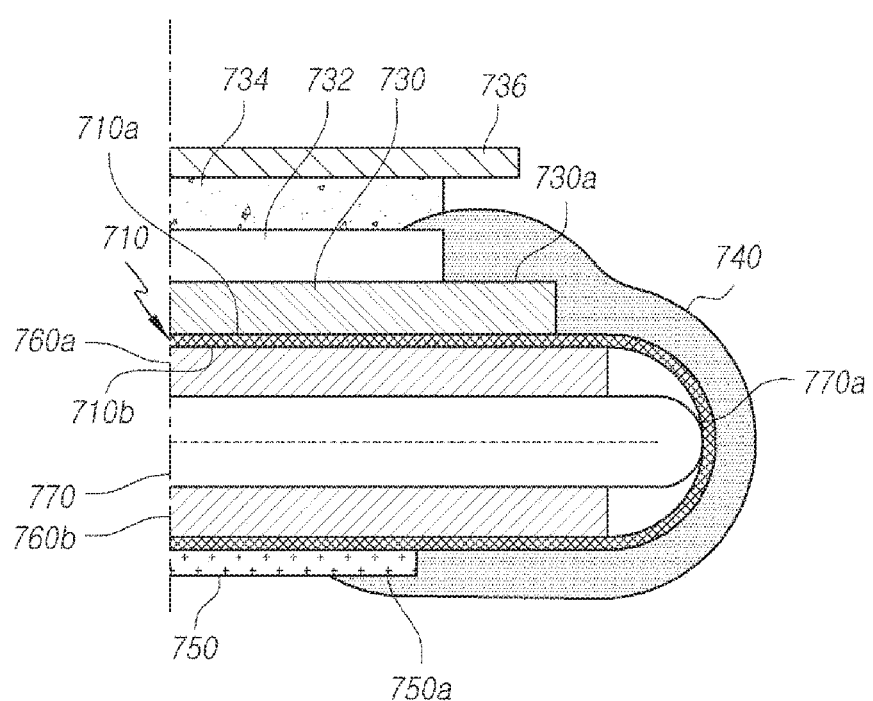
FIG. 7 is a cross section of a flexible display device according to an embodiment of the present invention.
Figure 8A:
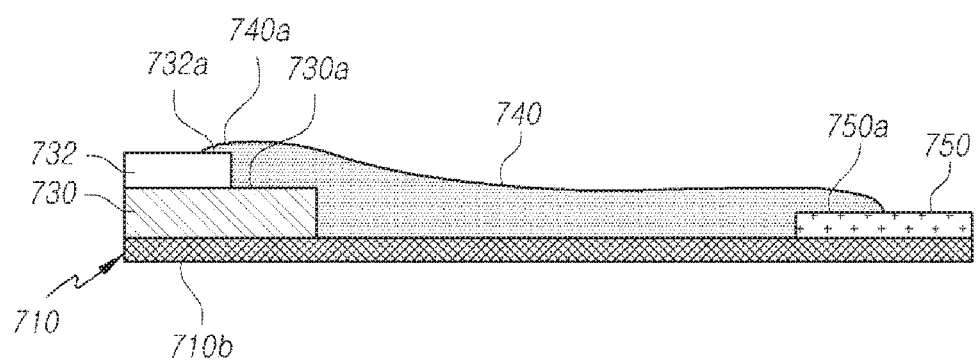
FIGS. 8A to 8C are cross sections of a flexible substrate, a display layer, and a drive integrated circuit connection member of the flexible display device of FIG. 7 under a non-bent condition.

FIG. 7 is a cross section of the flexible display device in a bent state according to an example embodiment of the present invention. FIG. 8C is a cross section of a flexible substrate, a display layer, and a drive IC connection member of the flexible display device of FIG. 7 under a non-bent condition. As shown in FIGS. 7 and 8A to 8C, a flexible display device 700 according to the example embodiment may include a flexible substrate 710 having a display area (DA) and a non-display area (NA) extending from the display area (DA), a display layer 730 disposed in the display area (DA) on a first surface 710*a* of the flexible substrate 710, a polarizing layer 732 disposed on the display layer 730, and a cover coat 740 disposed in the non-display area (NA) on the first substrate 710*a* of the flexible substrate 710.

The flexible display device 700 may include a first back plate 760*a* that is disposed on a second surface 710*b* of the flexible substrate 710 to correspond to the display layer 730, and a second back plate 760*b* that is disposed on the second surface 710*b* of the flexible substrate 710 opposite the first surface 710*a* and separated from the first back plate 760*a*.

The flexible display device 700 may include a supporting member 770 positioned between the first back plate 760*a* and the second back plate 760*b* in the vertical direction, and separated from the flexible substrate 710 in the vertical direction. As illustrated in FIG. 7, the head 770*a* of the supporting member 770 in a bent state may have a semicircular shape with a radius smaller than a radius of the flexible substrate 710 in a bent state, and be in contact with the second surface 710*b* of the flexible substrate 710, similar to the example shown in FIG. 2. Alternatively, the head 770*a* of the supporting member 770 may have a semicircular shape with a substantially same radius as the radius of the bent flexible substrate 710 so as to be substantially entirely in surface to surface contact with a bend area of the second surface 710*b* of the flexible substrate 710, similar to the examples shown in FIGS. 4A and 4B. Such alternative configurations may improve stability and curvature reliability of the supporting member 770. Here, the supporting member 770 may have a similar configuration as any one of the example supporting members 270 shown in FIGS. 2 and 4A to 4C, including the example of FIG. 4C in which the supporting member 770 does not have the head 770*a*.

As illustrated in FIG. 1, wiring may be disposed on the flexible substrate 710. The wiring may electrically connect the display layer 730 disposed in the display area (DA) of the flexible substrate 710 to the drive circuit section, or to the gate drive IC and the data drive IC disposed in the non-display area (NA) of the flexible substrate 710 for signal transmission. The wiring is formed of a conductive material, and may be formed of a conductive material with excellent softness or flexibility in order to minimize cracks when the flexible substrate 710 is bent.

A drive IC connection member 750 may be connected to the wiring in the non-display area (NA) of the flexible substrate 710, and the cover coat 740 may be disposed over the flexible substrate 710 between the display layer 730 and the drive IC connection member 750. As illustrated in FIG. 7, the cover coat 740 may be positioned between the display layer 730 and the drive integrated circuit connection member 750. As described above, the drive IC connection member 750 may be one of the tape carrier package (TCP) or the chip on film (COF).

At least a portion of the non-display area (NA) of the flexible substrate 710 may be positioned to have a shape that is bent in a bending direction. The flexible display device 700 may include the cover coat 740 that is disposed in the non-display area (NA) on a first surface 710a of the flexible substrate 710 and positioned to have a shape bent in the bending direction. The cover coat 740 may also be positioned to have a shape bent in the bending direction similarly to the bent portion of the non-display area (NA) of the flexible substrate 710.

An intermediate surface may be disposed between the portion of the non-display area (NA) of the flexible substrate 710 positioned to have a shape that is bent in a bending direction and the cover coat 740. Specifically, the wiring positioned in the non-display area (NA) of the flexible substrate 710 may form the intermediate surface as a dint in the flexible substrate 710 or the cover coat 740. When the portion of the non-display area (NA) of the flexible substrate 710 and the cover coat 740 are bent in the bending direction, a position at which strains on the portion of the non-display area (NA) of the flexible substrate 710 and the cover coat 740 caused by the bending become zero or near zero may be referred to as the intermediate surface.

A polarizing layer 732, an over coat layer 736, and a first adhesive layer 734 for bonding the polarizing layer 732 and the over coat layer 736 together may be disposed on the display layer 730. As illustrated in FIG. 8A, in a manufacturing stage in which the display layer 730 and the polarizing layer 732 are disposed in the display area (DA) of the flexible substrate 710 and the drive IC connection member 750 is disposed in the non-display area (NA) of the flexible substrate 710, an organic resin may be coated over the flexible substrate 710, from an end 750a of the drive IC connection member 750 in the non-display area (NA) of the flexible substrate 710 to an end 730 of the display layer 730 and an end 732a of the polarizing layer 732 in the display area (DA) of the flexible substrate 710, with the jetting process of FIG. 5. Then, the organic resin may be hardened to form the cover coat 740.

Figure 8B:
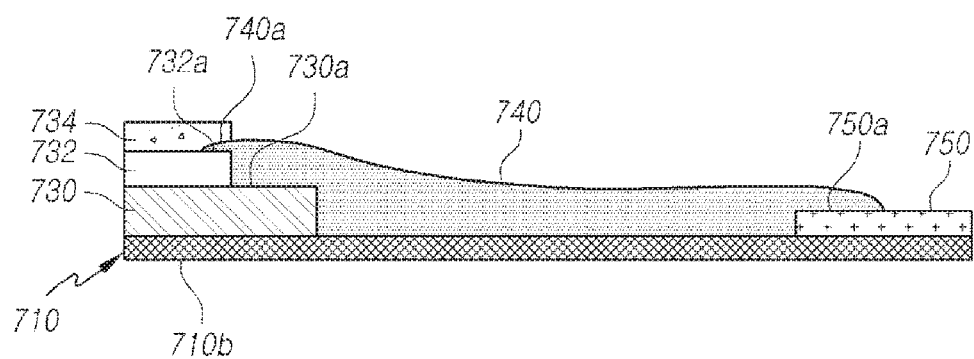
Figure 8C:
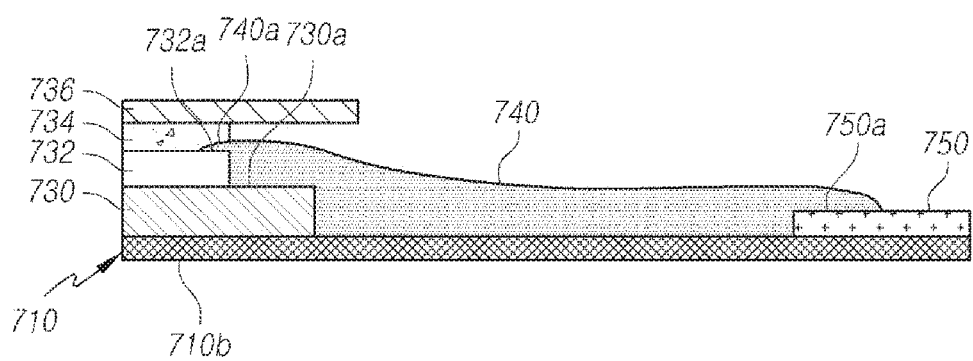

Next, as illustrated in FIGS. 8B and 8C, an end 740a of the cover coat 740 may be disposed on the end 730a of the display layer 730 and the end 732a of the polarizing layer 732. The first adhesive layer 734 may be disposed on the polarizing layer and the end 740a of the cover coat 740. Then, the over coat layer 736 may be disposed on the first adhesive layer 734 to be bonded to the polarizing layer 732 via the first adhesive layer 734. Next, a support structure of the first back plate 760a, the second back plate 760b, and the supporting member 770 may be disposed on the second surface 710b of the flexible substrate 710. Then, a bend area of the flexible substrate 710 may be bent so that the flexible display device 700 in a bent state as illustrated in FIG. 7 may be obtained.

In the flexible display device 700 illustrated in FIG. 8A, for example, the cover coat 740 may be formed with the jetting process before bonding the first adhesive layer 734 to the polarizing layer 732. Thus, if the organic resin 410 is coated over the polarizing layer 732 due to a process error, the end 740a of the cover coat 740 would be positioned between the polarizing layer 732 and the first adhesive layer 734 on the polarizing layer 732. As a result, an air gap does not occur between the first adhesive layer 734 and the over coat layer 736. Thus, it is possible to minimize or prevent adhesion failure of the over coat layer 736 or panel failure caused by the air gap occurring between the first adhesive layer 734 and the over coat layer 736.

Figure 9:
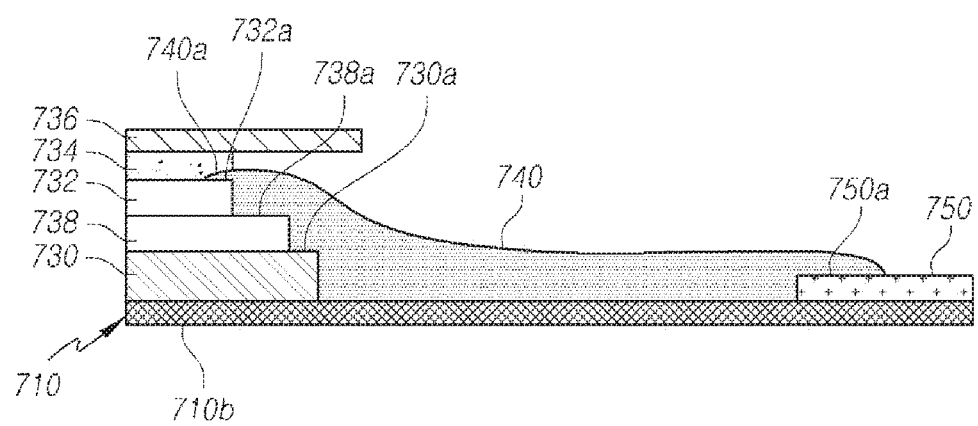
FIGS. 9, 10A, 10B, 11A, and 11B are cross sections of modified examples of the flexible display device of FIG. 7.

As illustrated in FIG. 9, the flexible display device 700 may further include a barrier layer 738 between the display layer 730 and the polarizing layer 732. If the flexible display device 700 includes barrier layer 738, the end 740a of the cover coat 740 may be positioned between the polarizing layer 732 and the first adhesive layer 734 on the barrier layer 738 and the polarizing layer 732. Specifically, the end 740a of the cover coat 740 may be positioned on the end 732a of the polarizing layer 732 between the polarizing layer 732 and the first adhesive layer 734, and on an end 738a of the barrier layer 738.

Figure 10A:
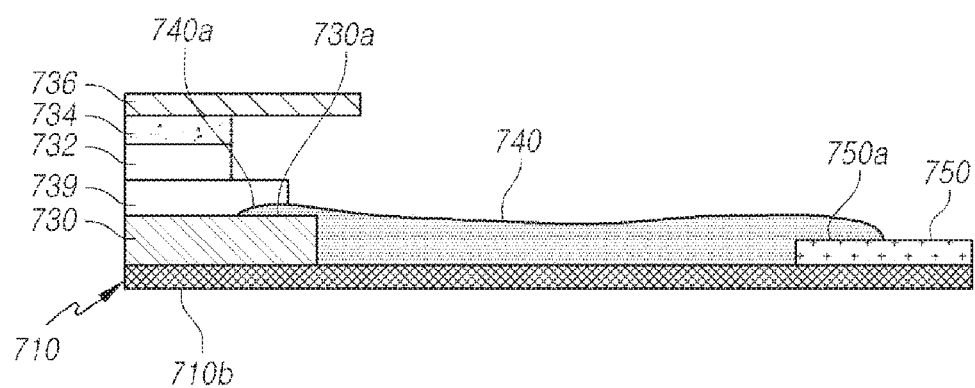
Figure 10B:
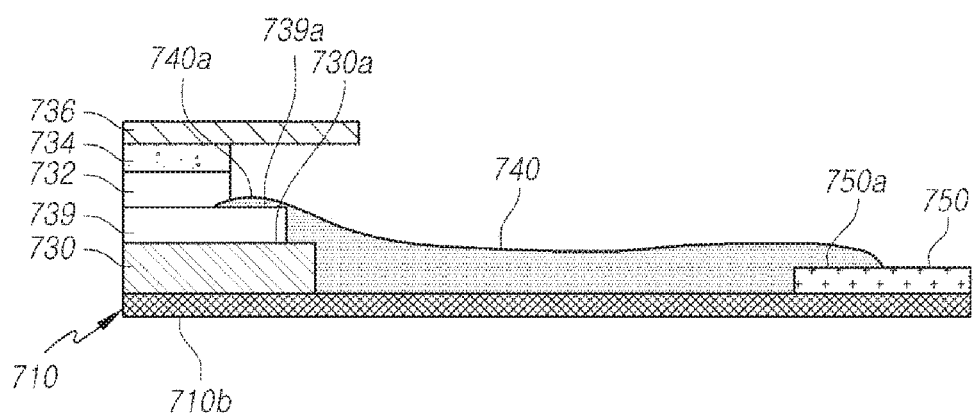

As illustrated in FIGS. 10A, 10B, 11A, and 11B, the flexible display device 700 may include a second adhesive layer 739 between the polarizing layer 732 and the display layer 730 in place of or in addition to the barrier layer 738. The flexible display device 700 may include the second adhesive layer 739 between the polarizing layer 732 and the display layer 730 or the barrier layer 738. The end 740a of the cover coat 740 may be positioned between the polarizing layer 732 and the first adhesive layer 734 as shown in FIGS. 8B and 8C, between the display layer 730 and the second adhesive layer 739 as shown in FIG. 10A, or between the second adhesive layer 739 and the polarizing layer 732 as shown in FIG. 10B.

As illustrated in FIG. 10A, if the barrier layer 738 is not included, the end 740a of the cover coat 740 may be positioned between the display layer 730 and the second adhesive layer 739 on the display layer 730. Specifically, the end 740a of the cover coat 740 may be positioned between the display layer 730 and the second adhesive layer 739 on the end 730a of the display layer 730.

Alternatively, as illustrated in FIG. 10B, if the barrier layer 738 is not included, the end 740a of the cover coat 740 may be positioned between the second adhesive layer 739 and the polarizing layer 732 on the second adhesive layer 739. Specifically, the end 740a of the cover coat 740 may be positioned between the second adhesive layer 739 and the polarizing layer 732 on the end 739a of the second adhesive layer 739.

Figure 11A:
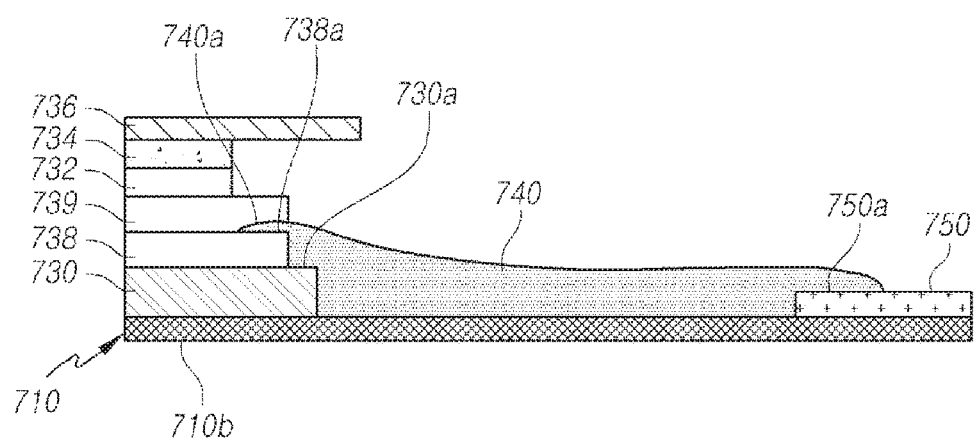

As illustrated in FIG. 11A, if the barrier layer 738 is included, the end 740a of the cover coat 740 may be positioned between the barrier layer 738 and the second adhesive layer 739 on the barrier layer 738. Specifically, the end 740a of the cover coat 740 may be positioned between the barrier layer 738 and the second adhesive layer 739 on the end 738a of the barrier layer 738.

Figure 11B:
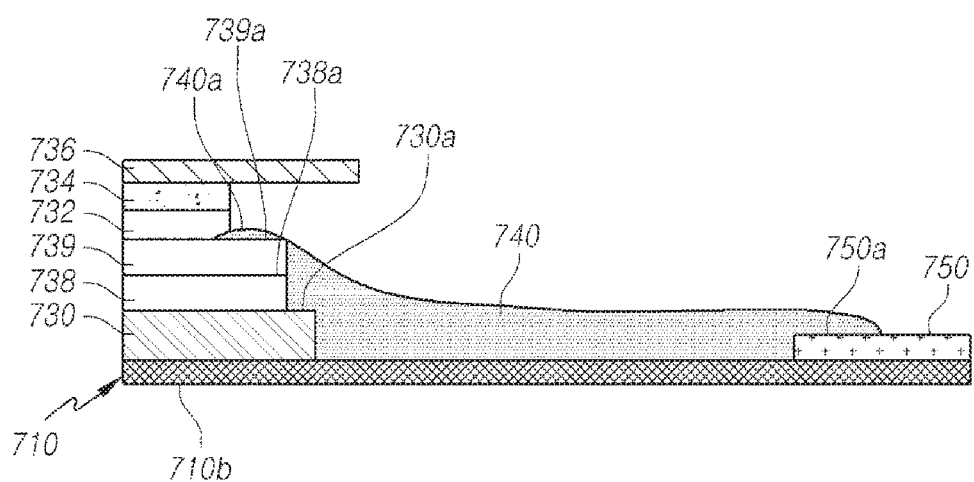

Alternatively, as illustrated in FIG. 11B, if the barrier layer 738 is included, the end 740a of the cover coat 740 may be positioned between the second adhesive layer 739 and the polarizing layer 732 on the second adhesive layer 739. Specifically, the end 740a of the cover coat 740 may be positioned between the second adhesive layer 739 and the polarizing layer 732 on the end 739a of the second adhesive layer 739.

In the example embodiments described above, the cover coat 740 is positioned in the non-display area (NA) on the first surface 710a of the flexible substrate 710, and the end 740a is disposed under the polarizing layer 732 or on the polarizing layer 732. That is, the end 740a of the cover coat 740 is disposed on at least one of the display layer 730, the barrier layer 738, the second adhesive layer 739, the polarizing layer 732, and the first adhesive layer 734. In forming the cover coat 740 by coating the organic resin 410 through the jetting process of FIG. 5, any one of the display layer 730, the barrier layer 734, the second adhesive layer 739, the polarizing layer 732, and a first adhesive layer 734 may be disposed on the display layer 730 as an element on which the end 740a of the cover coat 740 is to be disposed. Then, the organic resin 410 may be coated through the jetting process of FIG. 5 and hardened to form the cover coat 740.

In the example embodiments described above, the cover coat 740 may be positioned in the non-display area (NA) on the first surface 710a of the flexible substrate 710, and the end 740a is positioned under the polarizing layer 732 or on the polarizing layer 732. As a result, an air gap does not occur between the adhesive layer 734 and the over coat layer 736. Thus, it is possible to minimize or prevent adhesion failure of the over coat layer 736 or panel failure by a dint or an air gap formed between the adhesive layer 734 and the over coat layer 736.

As illustrated, for example, in FIGS. 7, 8A, 8B, 9, 10A, 10B, 11A, and 11B, the drive IC connection member 750 may be connected to the non-display area (NA) on the first surface 710a of the flexible substrate 710, and the cover coat 740 may cover an end 750a of the drive IC connection member 750.

Also, as described above, on the second surface 710b of the flexible substrate 710, the first back plate 760a may be disposed to correspond the display layer 730. The second back plate 760b may be disposed to correspond to the drive IC connection member 750 and may be positioned under the first back plate 760a when the flexible substrate 710 is bent in the bending direction. A supporting member 770 may be positioned between the first back plate 760a and the second back plate 760b in the vertical direction.

Similar to the examples shown in FIGS. 2, 3, and 4A to 4C, the example flexible display device 700 illustrated in FIG. 7 may include at least one of the first back plate 760a, the second back plate 760b, and the supporting member 770 under a bent condition, but is not limited thereto. Different variations of the support structure on the second surface 710b of the flexible substrate 710 may be implemented.

According to the example embodiments of the present invention described above, it is possible to prevent or reduce cracks in the flexible substrate or wiring when the flexible display device is bent. Also, according to the example embodiments of the present invention described above, it is possible to prevent or mitigate adhesion failure or panel failure in the flexible display device.

The foregoing description and the accompanying drawings of the example embodiments of the present invention are provided for illustrative purposes only and are not intended to limit the scope of the present invention. It will be apparent to those skilled in the art that various modifications and variations can be made in the flexible display device of the present invention without departing from the spirit or scope of the invention. Thus, it is intended that the present invention cover the modifications and variations of this invention and of the example embodiments described herein, provided they come within the scope of the appended claims and their equivalents.

What is claimed is:

1. A display apparatus, comprising:
   a substrate including a display area and a non-display area, the non-display area including a first area, a bend area, and second area, the second area bent behind the first area via the bend area;
   a display layer on the substrate;
   an adhesive layer on the display layer;
   a polarizing layer on the adhesive layer;
   a cover layer on the polarizing layer;
   a drive chip connection member on the second area;
   a wiring routed from the first area to the second area;
   a cover coating layer covering the bend area and having an edge portion between the display layer and the adhesive layer,
   wherein the cover coating layer is disposed apart from the cover layer, and
   wherein the cover coating layer entirely covers a side surface of the display layer and covers a part of an upper surface of the display layer.

2. The display apparatus of claim 1, further comprising a first back plate and a second back plate,
   wherein the first back plate is located below the substrate of the display area, and the second back plate is located below the substrate of the second area.

3. The display apparatus of claim 2, wherein a bottom surface of the first back plate faces a top surface of the second back plate.

4. The display apparatus of claim 3, further comprising a supporting member located between the first back plate and the second back plate.

5. The display apparatus of claim 1, wherein the wiring comprises at least one of titanium and aluminum.

6. The display apparatus of claim 1, wherein the wiring electrically connects the display layer disposed in the display area to the drive chip connection member disposed in the second area.

7. The display apparatus of claim 1, further comprising a second adhesive layer located between the polarizing layer and the cover layer.

8. The display apparatus of claim 1, wherein the drive chip connection member comprises at least one of a tape carrier package (TCP) and a chip on film (COF).

9. A flexible display device, comprising:
   a substrate having a first portion, a bend portion, and a second portion;
   a display layer disposed on the first portion of the substrate;
   an adhesive layer on the display layer;
   a polarizer on the adhesive layer;
   a cover layer on the polarizer;
   a connection member on the second portion of the substrate;
   a wiring extending between the connection member and the display layer on the substrate; and
   a cover coating layer on the bend portion of the substrate,
   wherein a first end portion of the cover coating layer extending under the adhesive layer and disposed on the first portion of the substrate,
   wherein the cover coating layer disposed on the wiring in the bend portion of the substrate,
   wherein the cover coating layer is disposed apart from the cover layer, and
   wherein the cover coating layer entirely covers a side surface of the display layer and covers a part of an upper surface of the display layer.

10. The flexible display device of claim 9, wherein the cover coating layer has a first thickness in the first portion and a second thickness in the bend portion, the first thickness being different from the second thickness.

11. The flexible display device of claim 10, wherein the first thickness is smaller than the second thickness.

12. The flexible display device of claim 9, wherein the cover coating layer is formed by coating an organic resin before disposing the adhesive layer.

13. The flexible display device of claim 9, further comprising a first back plate under the first portion and a second back plate under the second portion.

14. The flexible display device of claim 13, wherein the first back plate and the second back plate face each other due to a bent configuration at the bend portion.

15. The flexible display device of claim 14, further comprising a supporting member located between the first back plate and the second back plate.

16. The flexible display device of claim 15, wherein the supporting member is attached to at least a portion of the first back plate or the second back plate.

17. The flexible display device of claim 9, further comprising a second adhesive layer located between the polarizer and the cover layer.

18. The flexible display device of claim 9, wherein the connection member comprises at least one of a tape carrier package (TCP) and a chip on film (COF).

* * * * *